US009023707B1

(12) United States Patent
Ramkumar et al.

(10) Patent No.: US 9,023,707 B1
(45) Date of Patent: May 5, 2015

(54) SIMULTANEOUSLY FORMING A DIELECTRIC LAYER IN MOS AND ONO DEVICE REGIONS

(75) Inventors: Krishnaswamy Ramkumar, San Jose, CA (US); Bo Jin, Campbell, CA (US); Fredrick B. Jenne, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 204 days.

(21) Appl. No.: 13/312,964

(22) Filed: Dec. 6, 2011

Related U.S. Application Data

(63) Continuation of application No. 12/608,886, filed on Oct. 29, 2009, now Pat. No. 8,071,453.

(60) Provisional application No. 61/183,021, filed on Jun. 1, 2009, provisional application No. 61/172,324, filed on Apr. 24, 2009.

(51) Int. Cl.
*H01L 21/336* (2006.01)
*H01L 21/768* (2006.01)

(52) U.S. Cl.
CPC .................................. *H01L 21/768* (2013.01)

(58) Field of Classification Search
CPC ............... H01L 21/28282; H01L 21/8234; H01L 21/823412; H01L 27/105
USPC ................... 438/287, 197, 404, 594, 257
See application file for complete search history.

(56) References Cited

U.S. PATENT DOCUMENTS

| 6,479,339 B2 | 11/2002 | Nandakumar et al. |
| 6,548,856 B1 | 4/2003 | Lin et al. |
| 6,818,558 B1 | 11/2004 | Rathor et al. |
| 6,946,349 B1 | 9/2005 | Lee et al. |
| 6,949,787 B2 | 9/2005 | Snyder et al. |
| 7,091,089 B2 | 8/2006 | Steimle |
| 7,091,130 B1 | 8/2006 | Rao et al. |
| 7,315,474 B2 | 1/2008 | Lue |
| 7,390,718 B2 | 6/2008 | Roizin et al. |
| 7,429,767 B2 | 9/2008 | Bhattacharyya |
| 7,514,323 B2 | 4/2009 | Dobuzinsky et al. |
| 7,651,915 B2 | 1/2010 | Yan et al. |
| 7,678,662 B2 | 3/2010 | Arghavani et al. |

(Continued)

FOREIGN PATENT DOCUMENTS

WO 2013148196 A1 10/2013

OTHER PUBLICATIONS

U.S. Appl. No. 13/434,347: "Method of ONO Integration Into Logic CMOS Flow", Krishnaswamy Ramkumar, filed Mar. 29, 2012; 64 pages.

(Continued)

*Primary Examiner* — Peter Bradford
(74) *Attorney, Agent, or Firm* — Lowenstein Sandler LLP

(57) ABSTRACT

Methods of ONO integration into MOS flow are provided. In one embodiment, the method comprises: (i) forming a pad dielectric layer above a MOS device region of a substrate; and (ii) forming a patterned dielectric stack above a non-volatile device region of the substrate, the patterned dielectric stack comprising a tunnel layer, a charge-trapping layer, and a sacrificial top layer, the charge-trapping layer comprising multiple layers including a first nitride layer formed on the tunnel layer and a second nitride layer, wherein the first nitride layer is oxygen rich relative to the second nitride layer. Other embodiments are also described.

10 Claims, 15 Drawing Sheets

(56) References Cited

U.S. PATENT DOCUMENTS

| | | | |
|---|---|---|---|
| 7,811,886 B2 | 10/2010 | Winstead et al. | |
| 7,811,887 B2 | 10/2010 | Irani et al. | |
| 7,816,728 B2 | 10/2010 | Ho et al. | |
| 7,972,929 B2 | 7/2011 | Lee | |
| 8,071,453 B1 | 12/2011 | Ramkumar et al. | |
| 8,093,128 B2 | 1/2012 | Koutny et al. | |
| 8,120,095 B2 | 2/2012 | Ho et al. | |
| 8,614,124 B2 | 12/2013 | Jenne et al. | |
| 2002/0145159 A1 | 10/2002 | Ishii et al. | |
| 2003/0219947 A1 | 11/2003 | Shin et al. | |
| 2004/0110390 A1 | 6/2004 | Takagi et al. | |
| 2005/0110102 A1* | 5/2005 | Wang et al. | 257/411 |
| 2006/0035432 A1 | 2/2006 | Kim et al. | |
| 2006/0113605 A1 | 6/2006 | Currie | |
| 2006/0284236 A1 | 12/2006 | Bhattacharyya | |
| 2007/0018201 A1* | 1/2007 | Specht et al. | 257/204 |
| 2007/0087503 A1 | 4/2007 | Lusky | |
| 2007/0108497 A1* | 5/2007 | Shih et al. | 257/315 |
| 2007/0132054 A1 | 6/2007 | Arghavani et al. | |
| 2008/0090350 A1 | 4/2008 | Yan et al. | |
| 2008/0121983 A1* | 5/2008 | Seong et al. | 257/324 |
| 2008/0173928 A1 | 7/2008 | Arai et al. | |
| 2008/0290400 A1 | 11/2008 | Jenne et al. | |
| 2008/0293207 A1 | 11/2008 | Koutny et al. | |
| 2008/0293254 A1 | 11/2008 | Ramkumar et al. | |
| 2008/0296661 A1 | 12/2008 | Ramkumar et al. | |
| 2008/0296664 A1 | 12/2008 | Ramkumar et al. | |
| 2008/0296693 A1 | 12/2008 | Richter et al. | |
| 2009/0086548 A1 | 4/2009 | Wu et al. | |
| 2009/0104780 A1 | 4/2009 | Lee | |
| 2009/0152621 A1* | 6/2009 | Polishchuk et al. | 257/325 |
| 2009/0179254 A1 | 7/2009 | Van et al. | |
| 2009/0181530 A1 | 7/2009 | Lisiansky et al. | |
| 2010/0112769 A1 | 5/2010 | Son et al. | |
| 2010/0140684 A1 | 6/2010 | Ozawa | |
| 2010/0200908 A1 | 8/2010 | Lee et al. | |
| 2011/0275182 A1 | 11/2011 | Mouli | |
| 2012/0037977 A1 | 2/2012 | Lee et al. | |
| 2012/0068242 A1 | 3/2012 | Shin et al. | |

OTHER PUBLICATIONS

International Search Report for International Application No. PCT/US2013/03084 dated Jun. 14, 2013; 2 pages.

USPTO Non-Final Rejection for U.S. Appl. No. 12/60/,886 dated Apr. 26, 2011; 9 pages.

USPTO Non-Final Rejection for U.S. Appl. No. 13/434,347 dated Apr. 9, 2014; 11 pages.

USPTO Notice of Allowance for U.S. Appl. No. 12/608,886 dated Aug. 4, 2011; 8 pages.

Written Opinion of the International Searching Authority for International Application No. PCT/US13/30874 mailed Jun. 14, 2013; 7 pages.

USPTO Final Rejection for U.S. Appl. No. 13/434,347 dated Jul. 30, 2014; 17 pages.

USPTO Requirement for Restriction for U.S. Appl. No. 13/434,347 dated Dec. 18, 2013; 6 pages.

"Implementation of High K/Metal Gates in High Volume Manufacturing," Applied Materials, accessed from http://www.tel.uva.es/descargar.htm?id=6134; 5 pages.

Jeong-Mo Hwang, "Bringing Non-Volatile Memory Blocks to Socs Using the Sonos Process", Simtek Corporation; 11 pages.

USPTO Advisory Action for U.S. Appl. No. 13/434,347, dated Oct. 9, 2014; 3 pages.

USPTO Non-Final Rejection for U.S. Appl. No. 13/434,347, dated Nov. 19, 2014; 11 pages.

* cited by examiner

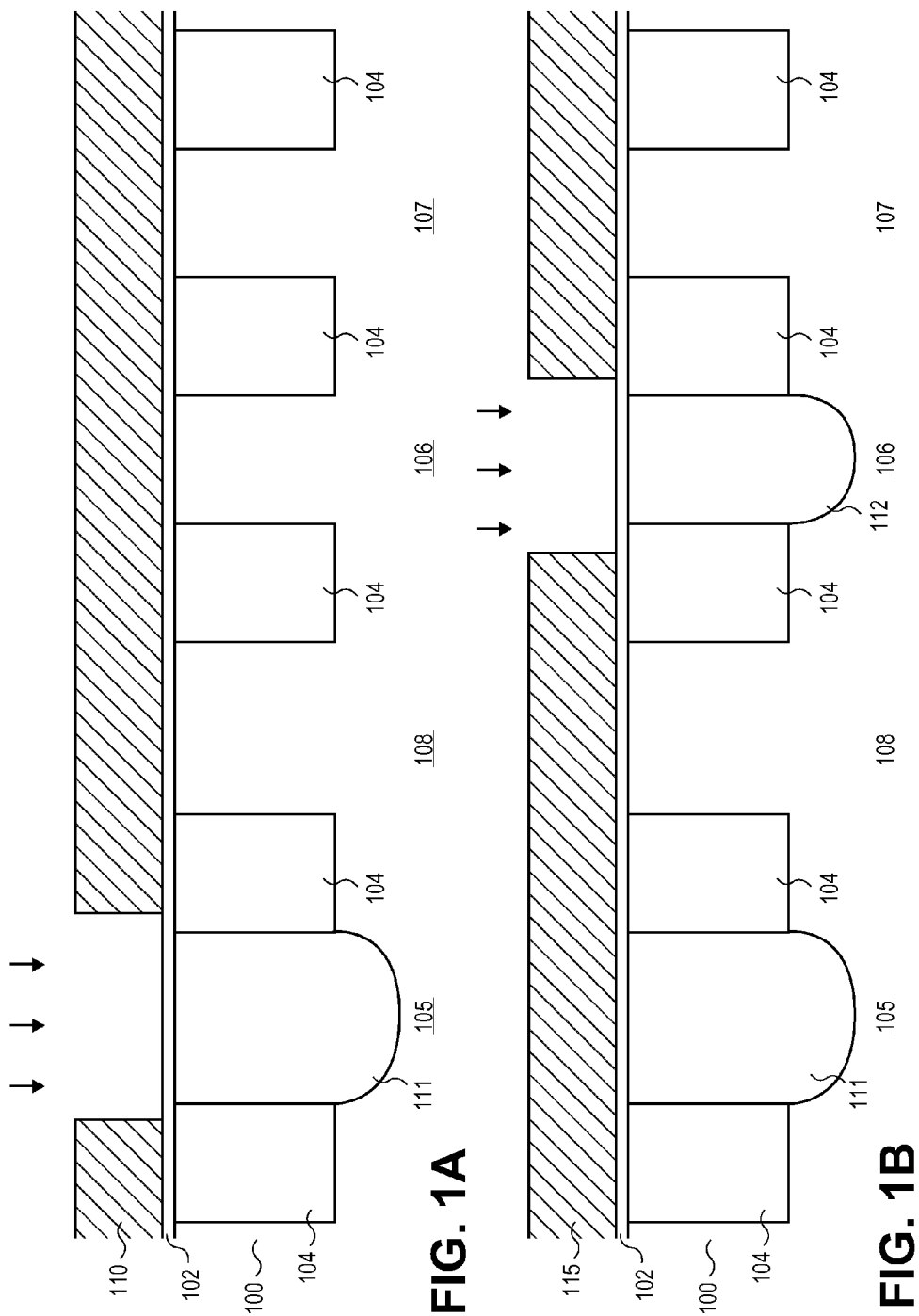

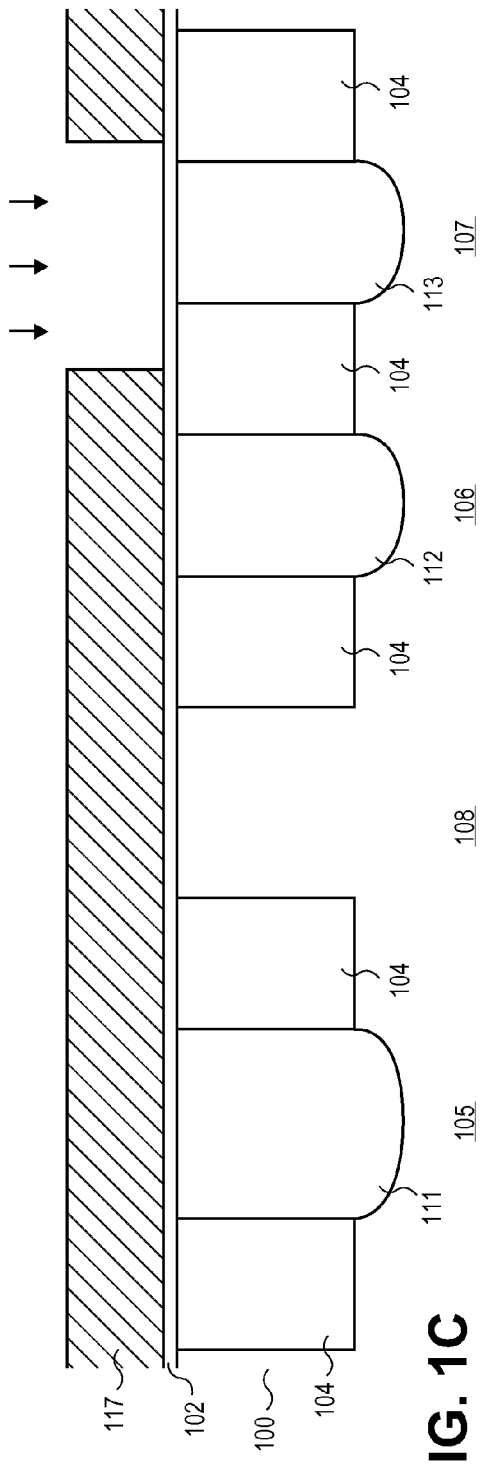
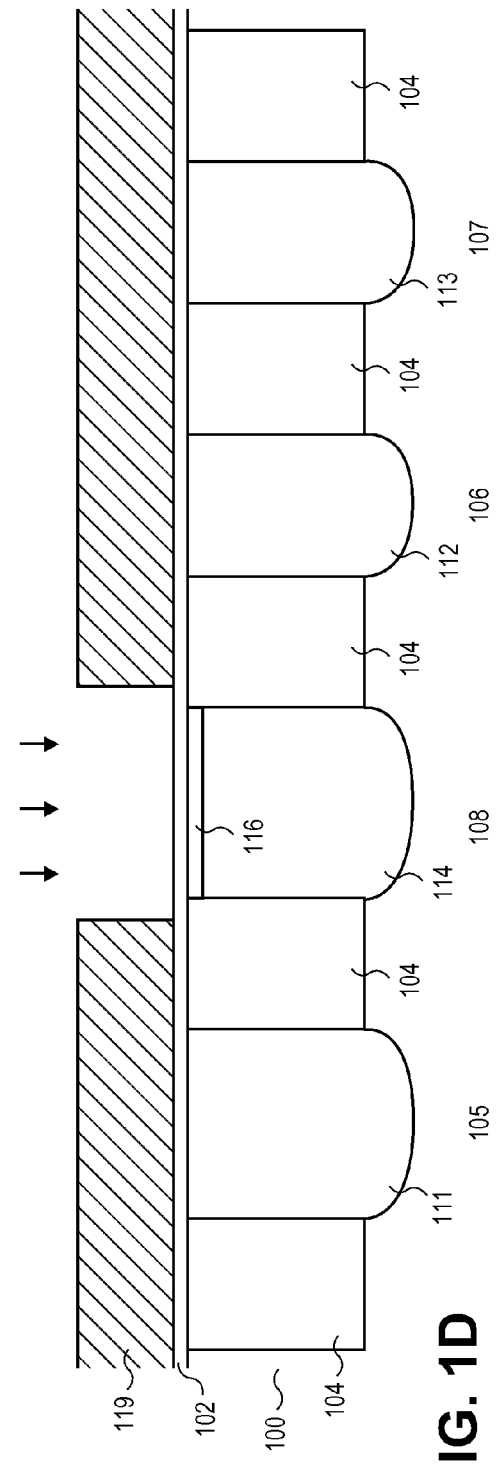

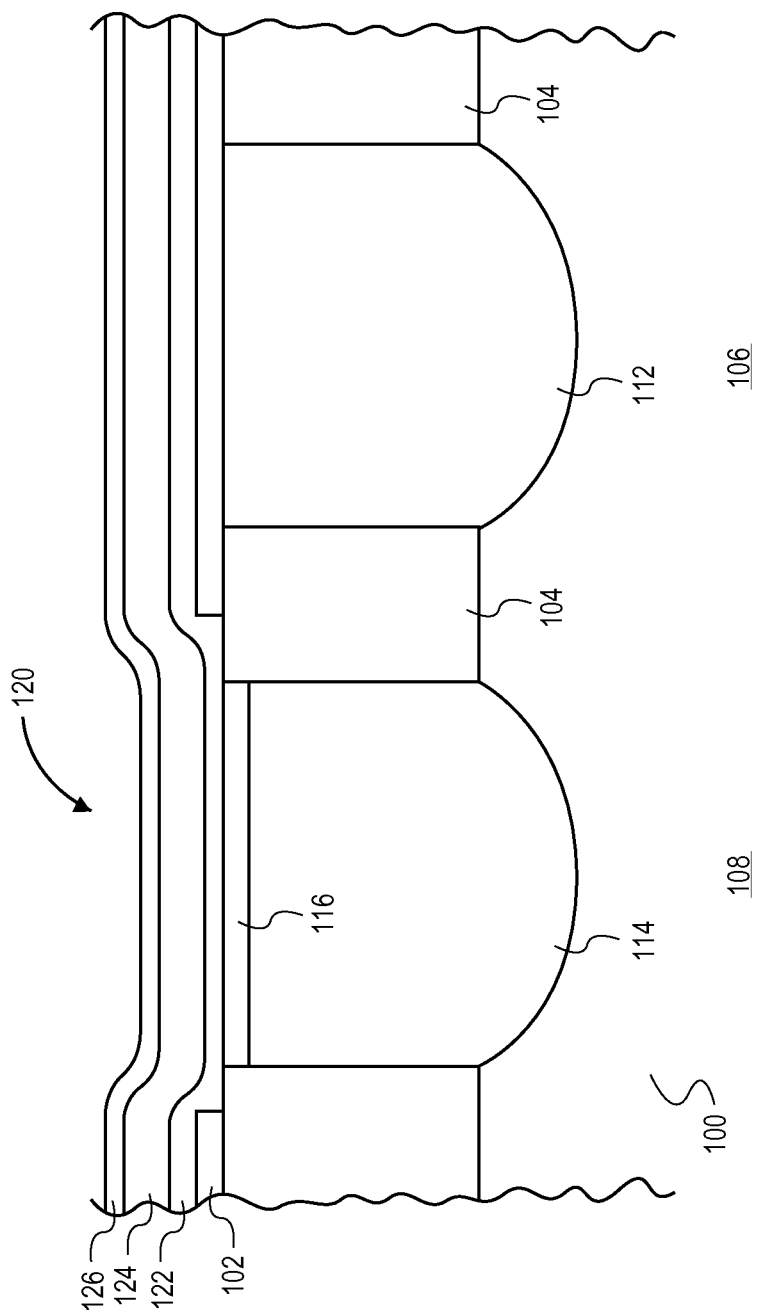

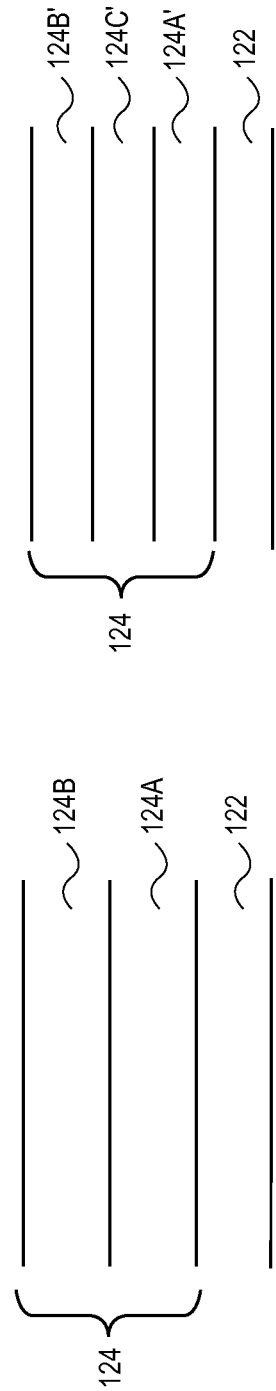

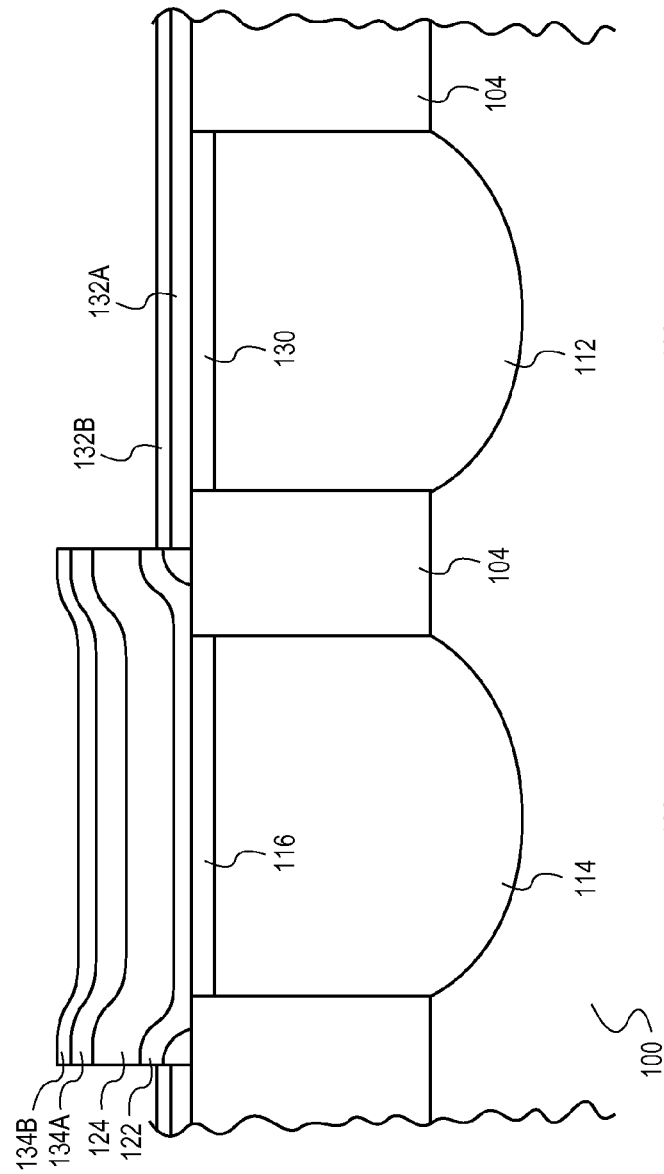

SIMULTANEOUSLY FORMING A DIELECTRIC LAYER IN MOS AND ONO DEVICE REGIONS

RELATED APPLICATIONS

This application is a continuation of U.S. application Ser. No. 12/608,886, filed Oct. 29, 2009, now U.S. Pat. No. 8,071,453 issued Dec. 6, 2011, which claims the benefit of U.S. Provisional Application No. 61/183,021, filed Jun. 1, 2009, and U.S. Provisional Application No. 61/172,324, filed Apr. 24, 2009.

TECHNICAL FIELD

Embodiments of the present invention relate to the field of semiconductor devices.

BACKGROUND

The fabrication of integrated circuits for logic products typically includes a baseline process for the production of metal-oxide-semiconductor field-effect transistors (MOSFETs). Thicknesses, geometries, alignment, concentrations, etc. are stringently controlled for each operation in such a baseline process to ensure that they are within specific tolerance ranges so that the resultant MOSFETs will function properly. For applications such as system-on-chip silicon-oxide-nitride-oxide-semiconductor (SONOS) FETs are often integrated into a MOSFET logic manufacturing process. This integration can seriously impact the baseline MOSFET process, and generally requires several mask sets and expense.

BRIEF DESCRIPTION OF THE DRAWINGS

FIGS. 1A-1D illustrate the formation of deep wells in the substrate, in accordance with an embodiment of the present invention.

FIG. 3A illustrates the formation of a dielectric stack, in accordance with an embodiment of the present invention.

FIGS. 3B-3C illustrate multiple layer charge-trapping layers, in accordance with an embodiment of the present invention.

FIGS. 7B-7C illustrate the formation of a blocking dielectric layer consuming a portion of a charge-trapping layer, in accordance with an embodiment of the present invention.

FIG. 7D illustrates a multiple layer gate dielectric layer and multiple layer blocking dielectric layer, in accordance with an embodiment of the present invention.

DETAILED DESCRIPTION

Figure 2A:
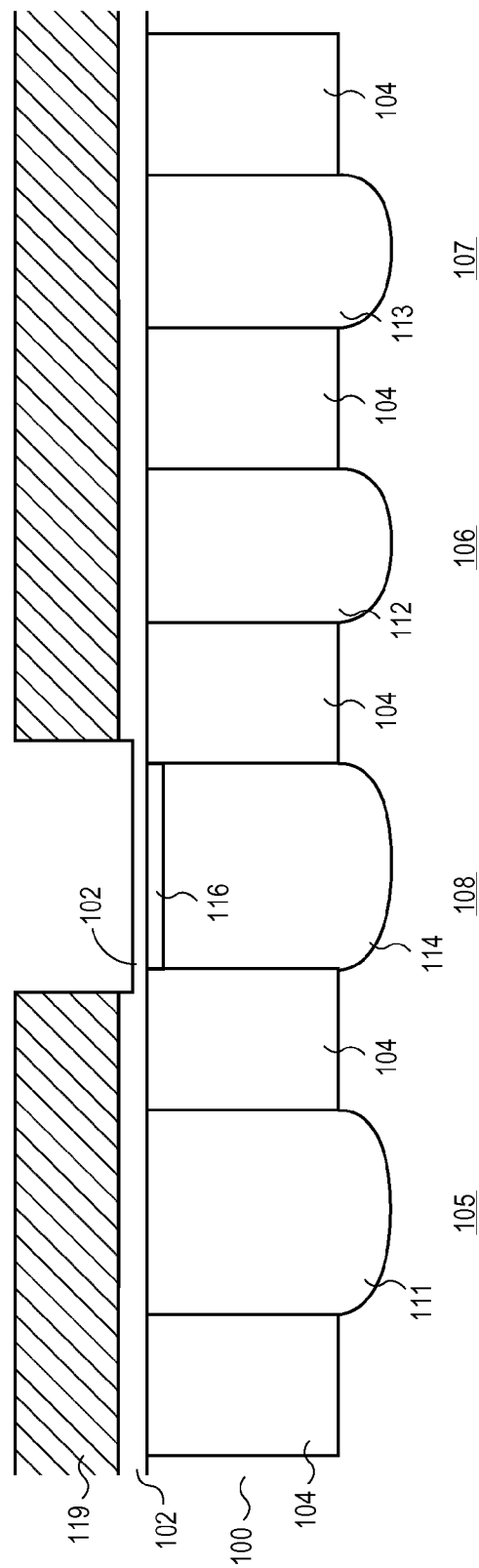
FIGS. 2A-2B illustrate removing a pad layer from a non-volatile device region of a substrate, in accordance with an embodiment of the present invention.

Embodiments of the present invention disclose methods of ONO integration into a MOS flow. In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "above," "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

A method of integrating a non-volatile memory device and a metal-oxide-semiconductor (MOS) device is described. In an embodiment, the MOS device is a volatile memory device, logic device and/or analog device. While particular embodiments of the invention are described herein with reference to a MOSFET device, it is understood that embodiments are not so limited. In an embodiment, the non-volatile memory device is any device with an oxide-nitride-oxide (ONO) dielectric stack. In an embodiment, the non-volatile memory device is an erasable-programmable-read-only memory EEPROM device. In one embodiment, the non-volatile memory device is a floating gate FLASH device. In another embodiment, the non-volatile memory device is a non-volatile charge trap memory device such as a semiconductor-oxide-nitride-oxide-semiconductor (SONOS). The first "semiconductor" in SONOS refers to a channel region material, the first "oxide" refers to a tunnel layer, "nitride" refers to a charge-trapping layer, the second "oxide" refers to a blocking dielectric layer, and the second "semiconductor" refers to a gate layer. A SONOS-type device, however, is not limited to these specific materials. For example, depending upon the specific device, the charge-trapping layer could include a conductor layer, semiconductor layer, or insulator layer. While the following embodiments of the present invention are described with reference to illustrations of a SONOS non-volatile memory device, embodiments are not limited to such.

In one aspect, embodiments of the invention disclose simultaneously forming the gate dielectric layer of a MOS device (e.g. MOSFET) and the top ONO layer of a non-volatile memory device (e.g. the blocking dielectric layer a SONOS FET). Fabrication of the ONO dielectric stack may be integrated into the baseline MOSFET manufacturing process for forming the MOSFET gate dielectric layer. A pad dielectric layer is formed above a volatile device region of a substrate. A patterned dielectric stack is formed above a non-volatile device region of the substrate. The patterned dielectric stack may comprise a tunnel layer, charge-trapping layer, and sacrificial top layer. The sacrificial top layer is then removed from the dielectric stack in the non-volatile device region of the substrate. The pad dielectric layer is removed from the volatile device region of the substrate. Then, simultaneously, a gate dielectric layer is formed above the volatile device region of the substrate and a blocking dielectric layer is formed above the charge-trapping layer above the non-volatile device region of the substrate.

In another aspect, embodiments of the invention disclose forming the first oxide and nitride layers of an ONO dielectric stack prior to adding channel implants to the MOS device (e.g. MOSFET). The thermal budget of forming the ONO dielectric stack may not impact the channel dopant profile for the MOS device. A pad dielectric layer is blanket deposited or grown above the substrate. SONOS channel dopants are implanted into the non-volatile device region of the substrate. The pad dielectric layer is removed from the non-volatile device region of the substrate, and a dielectric stack is formed above the non-volatile device region of the substrate where the pad dielectric layer has been removed. The patterned dielectric stack may comprise a tunnel layer, charge-trapping layer, and sacrificial top layer. MOSFET channel dopants are then implanted through the pad dielectric layer and into the MOS region of the substrate. The pad dielectric layer is removed from the MOS device region of the substrate simultaneously with the sacrificial top layer from the non-volatile device region of the substrate.

Referring to FIG. 1A, in an embodiment, the process begins with forming a protective pad layer 102 above the surface of a substrate 100. Substrate 100 may be composed of any material suitable for semiconductor device fabrication. In one embodiment, substrate 100 is a bulk substrate composed of a single crystal of a material which may include, but is not limited to, silicon, germanium, silicon-germanium or a III-V compound semiconductor material. In another embodiment, substrate 100 includes a bulk layer with a top epitaxial layer. In a specific embodiment, the bulk layer is composed of a single crystal of a material which may include but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 100 includes a top epitaxial layer above a middle insulator layer which is above a lower bulk layer. For example, the insulator may be composed of a material such as silicon dioxide, silicon nitride and silicon oxy-nitride.

Isolation regions 104 may be formed in the substrate 100. In an embodiment, isolation regions 104 separate a MOS device region and a non-volatile device region. In a particular embodiment, isolation regions 104 separate a high voltage field-effect transistor (HVFET) region 105, a SONOS FET region 108, an in/out select field-effect transistor (IO FET) 106 and a low voltage field-effect transistor (LVFET) region 107. In an embodiment, substrate 100 is a silicon substrate, pad layer 102 is silicon oxide, and isolation regions 104 are shallow trench isolation regions. Pad layer 102 may be a native oxide, or alternatively a thermally grown or deposited layer. In an embodiment, pad layer 102 is thermally grown with a dry oxidation technique at a temperature of 800° C.-900° C. to a thickness of approximately 100 angstroms.

Dopants are then implanted into substrate 100 to form deep wells of any dopant type and concentration. FIGS. 1A-1D illustrate the separate formation of deep wells for each particular device region of the substrate, however, it is to be appreciated that deep wells can be formed for multiple device regions of the substrate at the same time. In a particular embodiment illustrated in FIG. 1A, photoresist layer 110 is formed above pad layer 102 and patterned to form an opening above HVFET region 105. Dopants are implanted into the substrate to form deep well 111 in HVFET region 105 of the substrate. As illustrated in FIG. 1B, lithographic techniques, patterning, and implantation can be used to form a separate patterned photoresist layer 115 and deep well 112 in IO FET region 106. As illustrated in FIG. 1C, lithographic techniques, patterning, and implantation can be used to form a separate patterned photoresist layer 117 and deep well 113 in LVFET region 107. As illustrated in FIG. 1D, lithographic techniques, patterning, and implantation can be used to form a separate patterned photoresist layer 119 and deep well 114 in SONOS FET region 108. Dopants are also implanted into substrate 100 to form doped channel region 116. As illustrated in the embodiment of FIG. 1D, doped channel regions are not formed in the MOSFET regions 105, 106, or 107 so that out-diffusion does not occur during subsequent high temperature operations, and the baseline MOSFET fabrication process for the doped channel region does not need to be altered.

In another embodiment, doped channel regions are also formed for the IO FET region 106, LVFET region 107 and HVFET region 105 during the implantation operations illustrated in FIG. 1A-1D. In such an embodiment, the doped channel regions may diffuse during subsequent processing operations. Accordingly, such diffusion may need to be factored into a redesigned baseline MOSFET fabrication process.

Figure 2B:
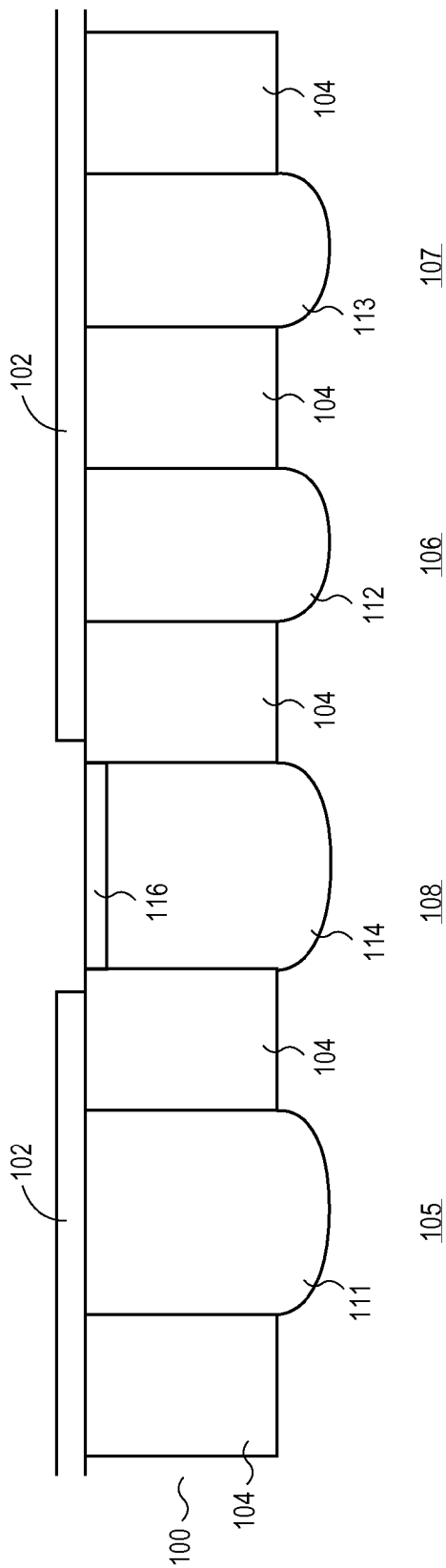

Referring to FIGS. 2A-2B, pad layer 102 is then removed from the non-volatile device region 108. In one embodiment, pad layer 102 is removed utilizing a dry-wet technique. Referring to FIG. 2A, the bulk of the pad layer 102 is removed using any suitable dry etching technique, such as a fluorine-based chemistry. In an embodiment, at least 85% of the pad layer 102 above the non-volatile device region 108 is removed with the dry etching technique. Referring to FIG. 2B, patterned photoresist layer 119 is then removed utilizing a suitable photoresist removal chemistry such as a sulfuric acid based chemistry, with an oxygen based plasma and ash, or a combination of both. A gate pre-clean chemistry is then applied to the substrate to remove the remainder of pad layer 102 from the surface of the substrate 100 in the non-volatile device region 108. In an embodiment, the pre-clean chemistry is a dilute hydrofluoric acid (HF) solution or buffered-oxide-etch (BOE) solution containing HF and ammonium fluoride ($NH_4F$). In such an embodiment, minimal lateral etching of pad layer 102 occurs in the opening above non-volatile device region 108, and pad layer 102 is also slightly etched above other regions of the substrate. In an embodiment, no more than 25% of the original thickness of pad layer 102 is removed from above regions 105, 106 and 107.

As illustrated in the embodiment of FIG. 3A, a dielectric stack 120 is then formed above the substrate 100. In an embodiment, the dielectric stack 120 includes a tunnel layer 122, a charge-trapping layer 124, and a sacrificial top layer 126. Tunnel layer 122 may be any material and have any thickness suitable to allow charge carriers to tunnel into the charge-trapping layer under an applied gate bias while maintaining a suitable barrier to leakage when the device is unbiased. In an embodiment, tunnel layer 122 is silicon dioxide, silicon oxy-nitride, or a combination thereof. Tunnel layer 122 can be grown or deposited. In one embodiment, tunnel layer 122 is grown by a thermal oxidation process. For example, a layer of silicon dioxide may be grown utilizing dry oxidation at 750 degrees centigrade (° C.)-800° C. in an oxygen atmosphere. In one embodiment, tunnel layer 122 is grown by a radical oxidation process. For example, a layer of silicon dioxide may be grown utilizing in-situ steam generation (ISSG). In another embodiment, tunnel dielectric layer 122 is deposited by chemical vapor deposition or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel layer 122 is a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide. Thus, in one embodiment, tunnel layer 122 includes a high-K dielectric portion. In a specific embodiment, tunnel layer 122 has a thickness of 18-20 angstroms.

Charge-trapping layer 124 may be any material and have a thickness which is greater than the nominal thickness suitable to store charge, since a top portion of the charge trapping layer 124 is consumed during a subsequent processing operation. In an embodiment, charge-trapping layer is 105-135 angstroms thick. In an embodiment, charge-trapping layer 124 is formed by a chemical vapor deposition technique and is composed of a dielectric material which may include, but is not limited to stoichiometric silicon nitride, silicon-rich silicon nitride, silicon oxy-nitride and oxygen rich silicon oxy-nitride. In an embodiment, charge trapping layer 126 includes multiple layers which are created by modifying the flow rate of ammonia ($NH_3$) gas, nitrous oxide ($N_2O$) and dichlorosilane ($SiH_2Cl_2$). The flow of dichlorosilane can be increased to create a silicon rich film such as silicon nitride. The flow rate of nitrous oxide can be increased to create an oxide rich film such as silicon oxy-nitride. The flow rate of ammonia can be increased to create a nitrogen rich film such as silicon nitride.

In one embodiment, charge-trapping layer 124 is composed of a lower layer and an upper layer, with the upper layer being more readily oxidized than the lower layer. In an embodiment, the lower layer has a greater oxygen content than the upper layer, and the upper layer has a greater silicon content than the lower layer. For example, as illustrated in FIG. 3B, charge-trapping layer 124 is composed of lower layer 124A and upper layer 124B. Lower layer 124A may comprise silicon oxy-nitride which contains more oxygen than the upper layer 124B, and the upper layer 124B may comprise silicon nitride or silicon oxy-nitride which contains more silicon than the lower layer 124A. In an embodiment, lower layer 124A comprises 30%+/−5% oxygen, 20%+/−10% nitrogen, and 50%+/−10% silicon, by atomic percent. In an embodiment, the upper layer comprises 0-7% oxygen, 30-57% nitrogen, and 43-65% silicon, by atomic percent. In an embodiment, upper layer 124B comprises stoichiometric $Si_3N_4$. In an embodiment, the lower layer 124A is deposited by flowing dichlorosilane, ammonia and nitrous oxide into a chemical vapor deposition chamber at a temperature of approximately 750-850° C. In an embodiment, lower layer 124A is 40-50 angstroms thick and upper layer 124B is approximately 70-80 angstroms thick.

In another embodiment illustrated in FIG. 3C, charge trapping layer 124 is composed of a lower layer, middle layer and upper layer. In an embodiment, lower layer 124A' is oxide rich, middle layer 124C' is silicon rich, and upper layer 124B' is silicon and/or nitrogen rich. In an embodiment, lower layer 124A' is composed of silicon oxy-nitride, middle layer 124C' is composed of silicon oxy-nitride, and upper layer 124B' is composed of silicon oxy-nitride or $Si_3N_4$. In an embodiment, lower layer 124A' comprises 30%+/−5% oxygen, 20%+/−10% nitrogen, and 50%+/−10% silicon, by atomic percent. In an embodiment, middle layer 124C' comprises 5%+/−2% oxygen, 40%+/−10% nitrogen, and 55%+/−10% silicon, by atomic percent. In an embodiment, upper layer 124B' comprises 0-7% oxygen, 30-57% nitrogen, and 43-65% silicon, by atomic percent. The thickness of upper layer 124B' is adjusted such that no more than 10% of middle layer 124C' is consumed during the operation described with regard to FIG. 7C. In an embodiment, lower layer 124A' is 40-50 angstroms thick, middle layer 124C' is 40-50 angstroms thick, and upper layer 124B' is approximately 30 angstroms thick.

Referring again to FIG. 3A, a sacrificial top layer 126 is blanket deposited above charge-trapping layer 124. In an embodiment, sacrificial top layer 126 is silicon dioxide. In an embodiment, sacrificial top layer 126 is deposited utilizing a chemical vapor deposition technique utilizing precursors such as dicholorisilane and nitrous oxide. In an embodiment, the entire dielectric stack 120 can be formed in a chemical vapor deposition chamber such as a low pressure chemical vapor deposition (LPCVD) chamber. In one embodiment, tunnel layer 122 is thermally grown in the LPCVD chamber, while charge-trapping layer 124 and sacrificial top layer 126 are both deposited in the LPCVD chamber.

Figure 4:
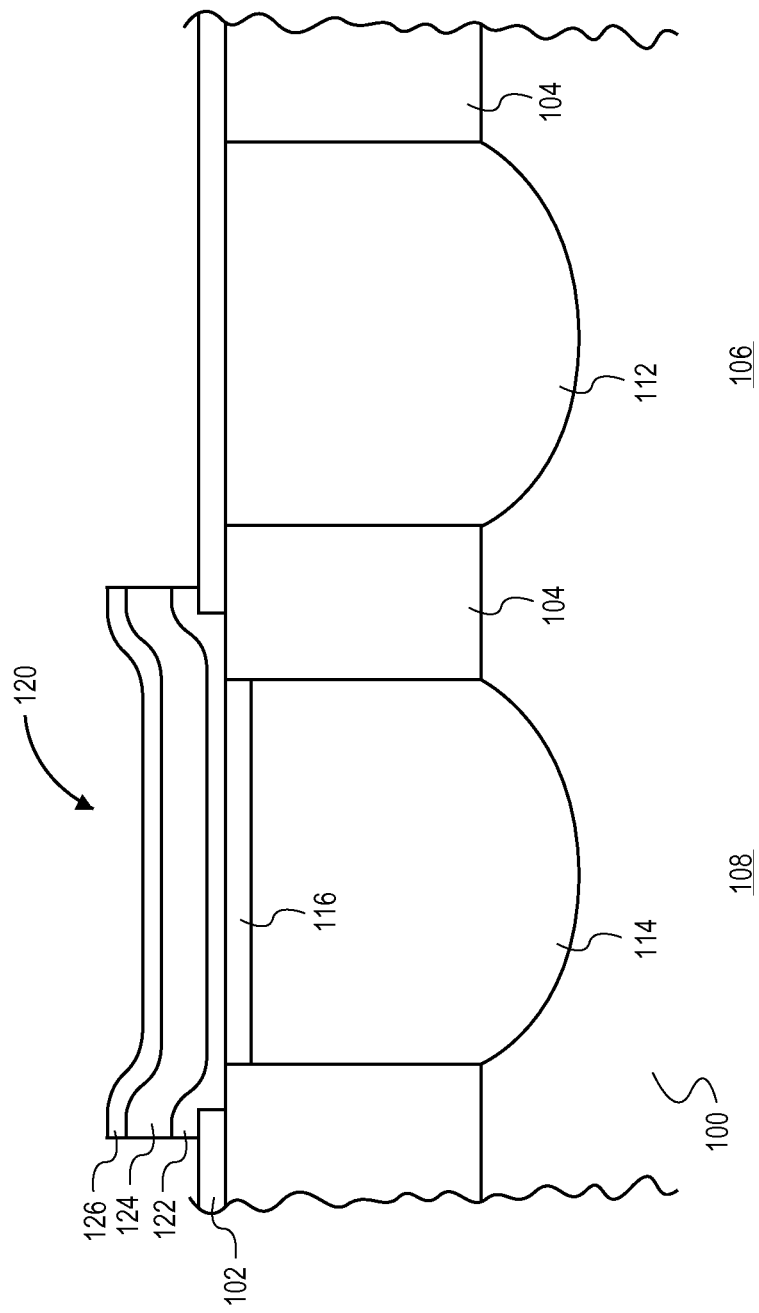
FIG. 4 illustrates a patterned dielectric stack above a non-volatile device region of a substrate, in accordance with an embodiment of the present invention.

The dielectric stack 120 is then patterned above the nonvolatile device region utilizing standard lithographic techniques as illustrated in the embodiment of FIG. 4. In an embodiment, patterning comprises dry etching with a fluorine based chemistry. In an embodiment, etching stops on the pad layer 102 and does not expose substrate 100 in the MOS device region 106. In such an embodiment, the pad layer 102 can protect the top surface of substrate 100 from damage during a subsequent implantation operation. In an alternative embodiment, pad layer 102 may be removed from the substrate utilizing a conventional pre-clean chemistry such as a diluted HF solution. In such an embodiment, doped channel regions may have already been formed in the substrate during a previous processing operation, such as during the deep well formation illustrated in FIG. 1A-1D.

Figure 5A:
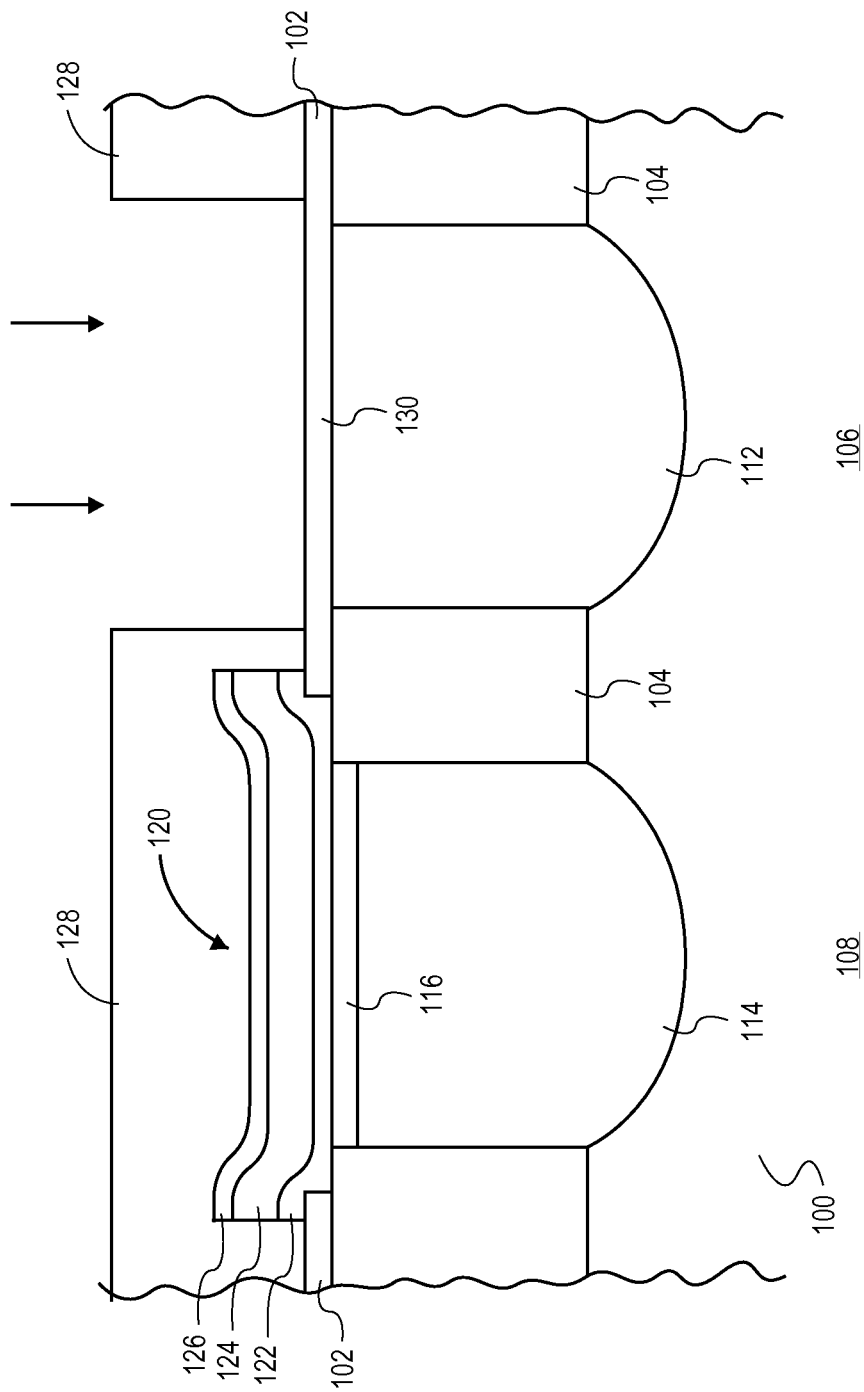
FIGS. 5A-5B illustrate the formation of doped channel regions, in accordance with an embodiment of the present invention.
Figure 5B:
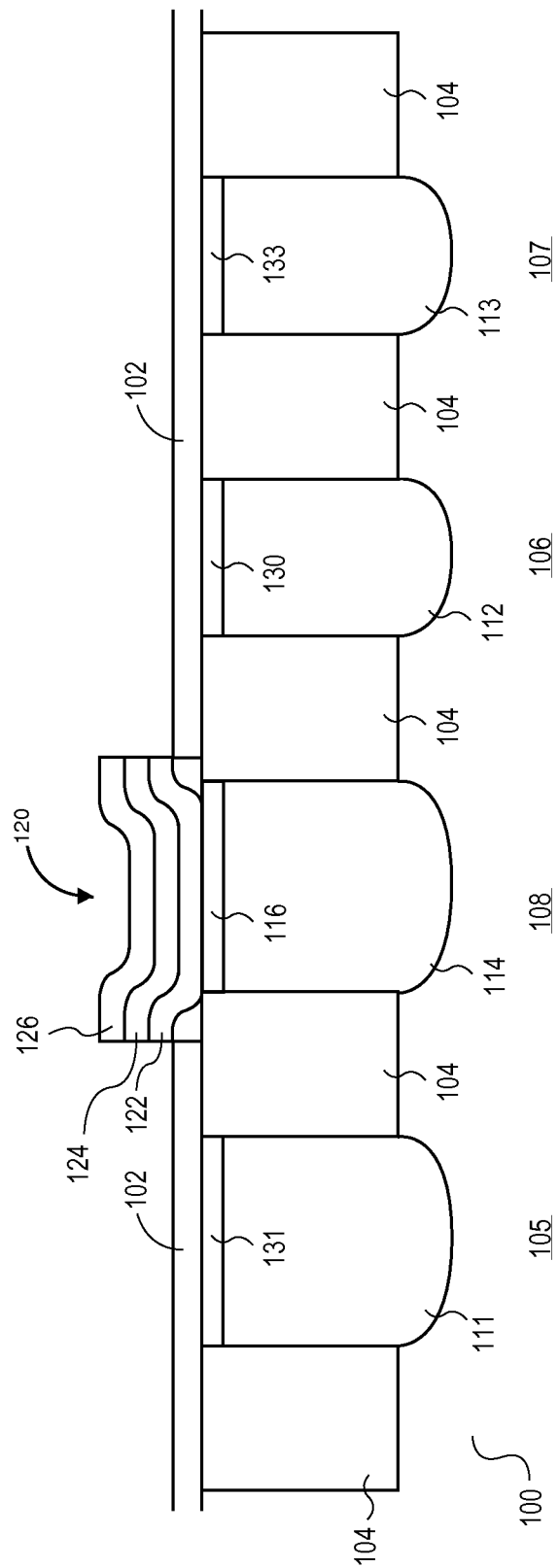

Referring to the embodiment of FIG. 5A, a photoresist layer 128 is formed above the substrate and patterned above the MOS device region 106. Dopants are implanted into the substrate 100 to form doped channel region 130. In an embodiment, pad layer 102 protects the top surface of substrate 100 from damage during the implantation operation. The lithographic and implantation techniques may be repeated to form doped channel regions 131 and 133 as illustrated in FIG. 5B.

Figure 6:
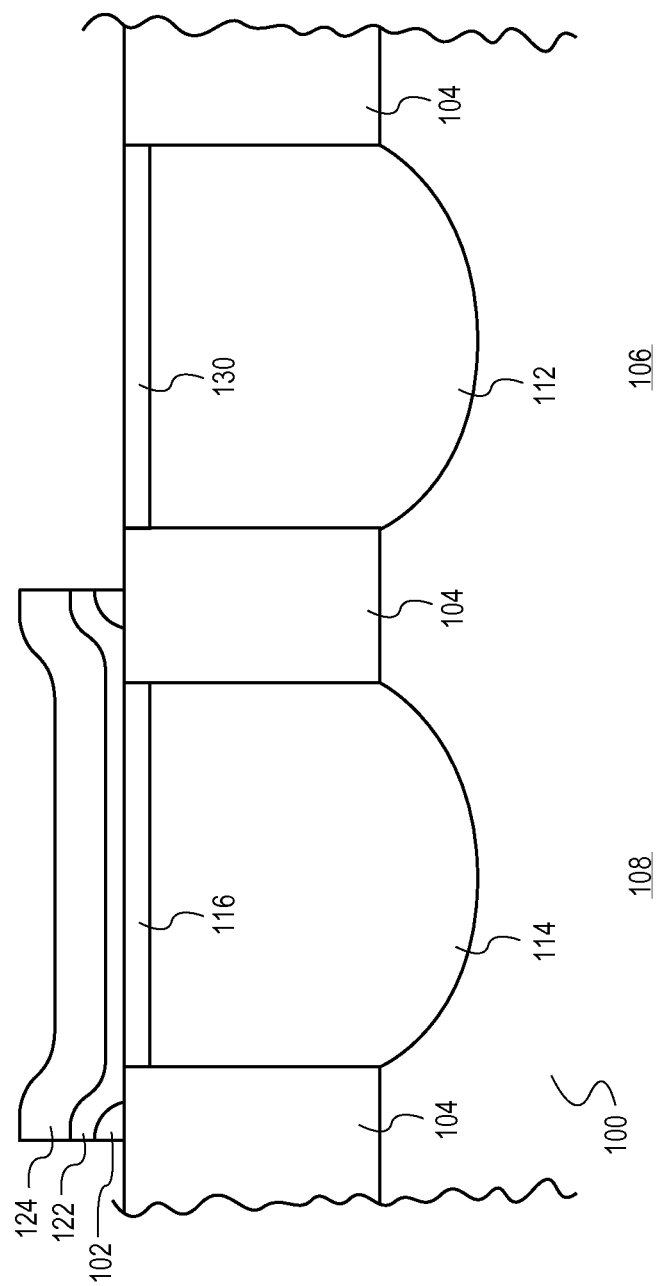
FIG. 6 illustrates the removal of a pad layer from a MOS device region and the removal of a sacrificial top layer from a non-volatile device region of a substrate, in accordance with an embodiment of the present invention.

Referring to FIG. 6, photoresist layer 128, pad layer 102 and sacrificial top layer 126 are removed. Photoresist layer 128 is removed utilizing any suitable photoresist removal chemistry. In an embodiment, pad layer 102 and sacrificial top layer 126 are simultaneously removed. In an embodiment, the substrate is exposed to a standard gate pre-clean chemistry such as a dilute HF solution or BOE solution to remove the sacrificial top layer 126 and pad layer 102. As illustrated in FIG. 6, some amount of pad oxide layer 102 may remain underneath an edge of tunnel layer 122 depending upon exposure time to gate pre-clean chemistry and method of forming tunnel layer 122.

Figure 7A:
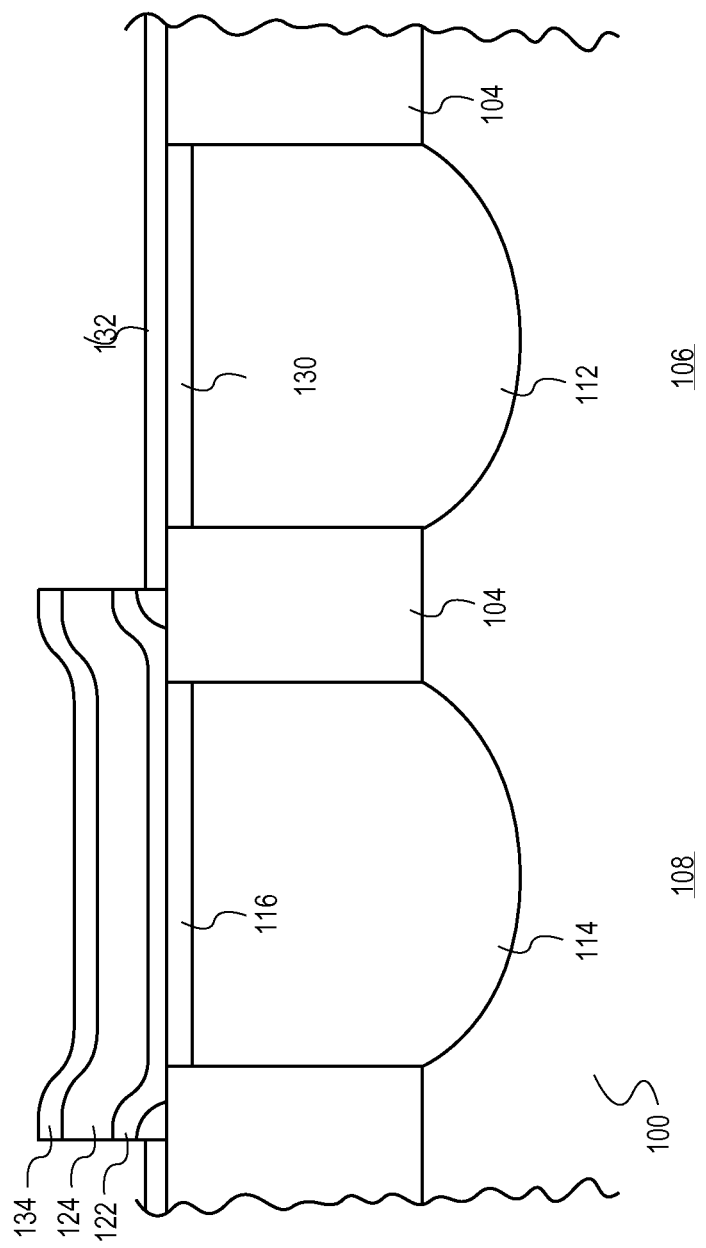
FIG. 7A illustrates the formation of a gate dielectric layer and blocking dielectric layer, in accordance with an embodiment of the present invention.

Referring to the embodiment of FIG. 7A, gate dielectric layer 132 and blocking dielectric layer 134 are simultaneously formed. Layers 132 and 134 may be formed utilizing any technique suitable for the formation of a MOS device gate dielectric layer. In an embodiment, layers 132 and 134 may be formed utilizing a technique capable of oxidizing both the substrate 100 and charge-trapping layer 124. In an embodiment gate dielectric layer 132 and blocking dielectric layer 134 are formed utilizing a radical oxidation technique, such as ISSG or plasma-based oxidation, and consume a portion of the substrate 100 and charge-trapping layer 124, respectively.

In an embodiment, the thickness of the charge trapping layer 124 and the complete sacrificial layer 126 removal during the gate pre-clean operation illustrated in FIG. 6 can be tailored such that blocking dielectric layer 134 can be formed simultaneously with the gate dielectric layer 132 in accordance with an established MOSFET baseline process. Thus, charge trapping layer 124 can be integrated into an established baseline MOSFET process utilizing the same parameters as those established in the baseline MOSFET process for forming gate dielectric layer 132 in a non-integrated scheme. In addition, the high temperatures such as 750-850° C. which may be used to form the dielectric gate stack 120 illustrated in FIG. 4 do not affect the baseline dopant profile in the non-volatile device doped channel region 130 because the tunnel layer 122 and charge-trapping layer 124 are formed prior to implanting the doped channel region 130, and blocking dielectric layer 134 is formed simultaneously with forming the gate dielectric layer 132. Accordingly, in such an embodiment any diffusion of channel dopants during formation of the gate dielectric layer 132 is accounted for in the baseline MOSFET logic manufacturing process.

In an embodiment, blocking dielectric layer 134 may be composed of any material and have any thickness suitable to maintain a barrier to charge leakage without significantly decreasing the capacitance of the non-volatile device gate stack. In one embodiment, the thickness of the blocking dielectric layer 134 is determined by the thickness for which gate dielectric layer 132 is to be made, and the composition of the uppermost part of charge-trapping layer 124. In an embodiment illustrated in FIG. 7B and FIG. 7C, blocking dielectric layer 134 is grown by consuming an upper portion of charge-trapping layer 124. In one embodiment illustrated in FIG. 7B, blocking dielectric layer 134 is grown by consuming a portion of upper layer 124B in FIG. 3B. In an embodiment, blocking dielectric layer 134 consumed approximately 25-35 angstroms of blocking dielectric layer 134. In one embodiment illustrated in FIG. 7C, blocking dielectric layer 134 is grown by consuming a portion of upper layer 124B' in FIG. 3C. In an embodiment, the upper layer 124B' is completely consumed to provide a blocking dielectric layer 134 with uniform composition. In an embodiment, upper layer 124B' is completely consumed and less than 10% of the thickness of middle layer 124C' is consumed during the formation of blocking dielectric layer 134. In an embodiment, upper layer 124B or 124B' is silicon oxy-nitride containing approximately 30-57 atomic percent nitrogen. In such an embodiment, where blocking dielectric layer 134 is formed by ISSG, the blocking layer 134 may have a uniform silicon oxy-nitride composition containing less than 10 atomic percent nitrogen. In an embodiment, the thickness of the blocking dielectric layer 134 is approximately 25-35 angstroms.

In another embodiment, gate dielectric layer 132 and/or blocking dielectric layer 134 can include multiple layers. In an embodiment illustrated in FIG. 7D, a second dielectric layer 132B/134B is deposited above the oxidized portion 132A of the substrate and 134A of the charge-trapping layer. In an embodiment the second layer 132B/134B may have a larger dielectric constant than the underlying oxidized portion 132A/134A. For example, layer 132B/134B may comprise a material such as, but not limited to, aluminum oxide, hafnium oxide, zirconium oxide, hafnium oxy-nitride, hafnium zirconium oxide or lanthanum oxide.

Figure 8:
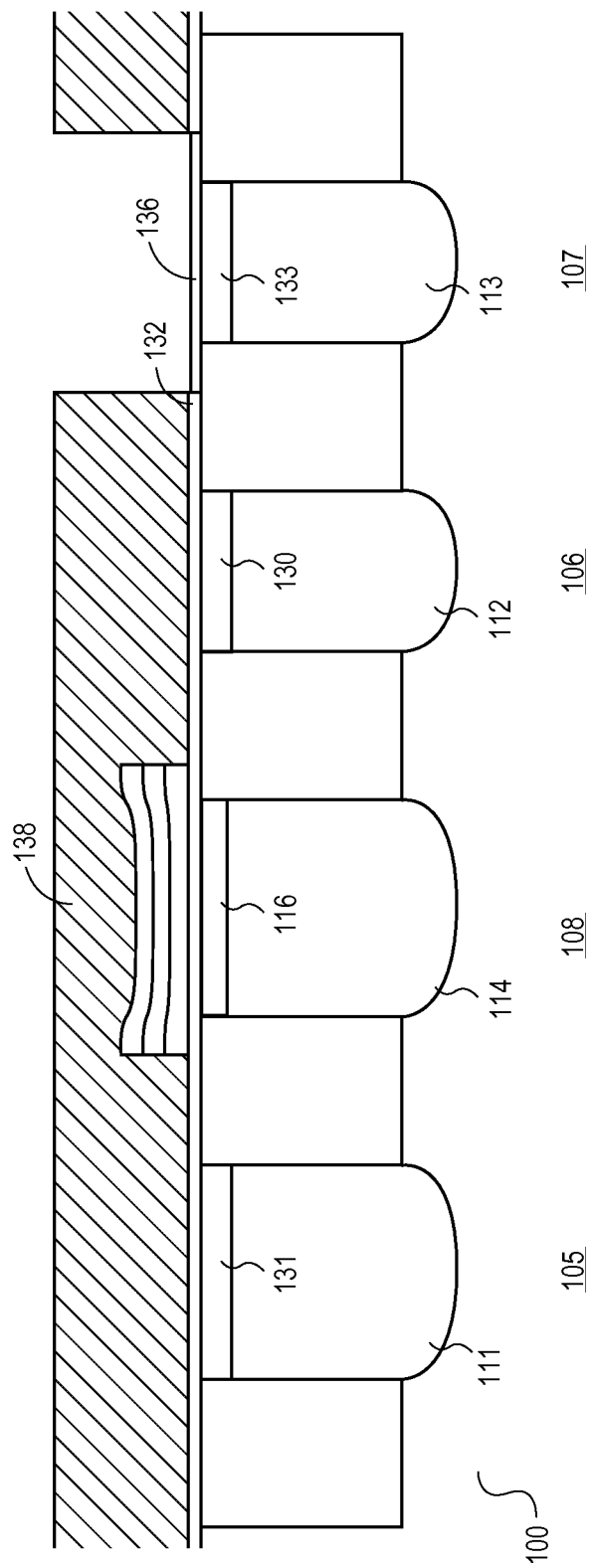
FIG. 8 illustrates the formation of a gate dielectric layer, in accordance with an embodiment of the present invention.

Referring to FIG. 8, in accordance with a specific embodiment a photoresist layer 138 is formed above the substrate and patterned to form an opening above LVFET region 107. Gate dielectric layer 132 is then removed from LVFET region 107. In an embodiment, gate dielectric layer 132 is removed by exposure to a dilute HF solution, or BOE solution. A replacement gate dielectric layer 136 is then formed above the exposed portion of substrate 100. Any suitable method for forming a gate dielectric layer in a MOS memory device may be utilized such as, but not limited to, dry oxidation or ISSG. Photoresist layer 138 is then removed from the substrate utilizing any suitable photoresist removal chemistry.

Figure 9:
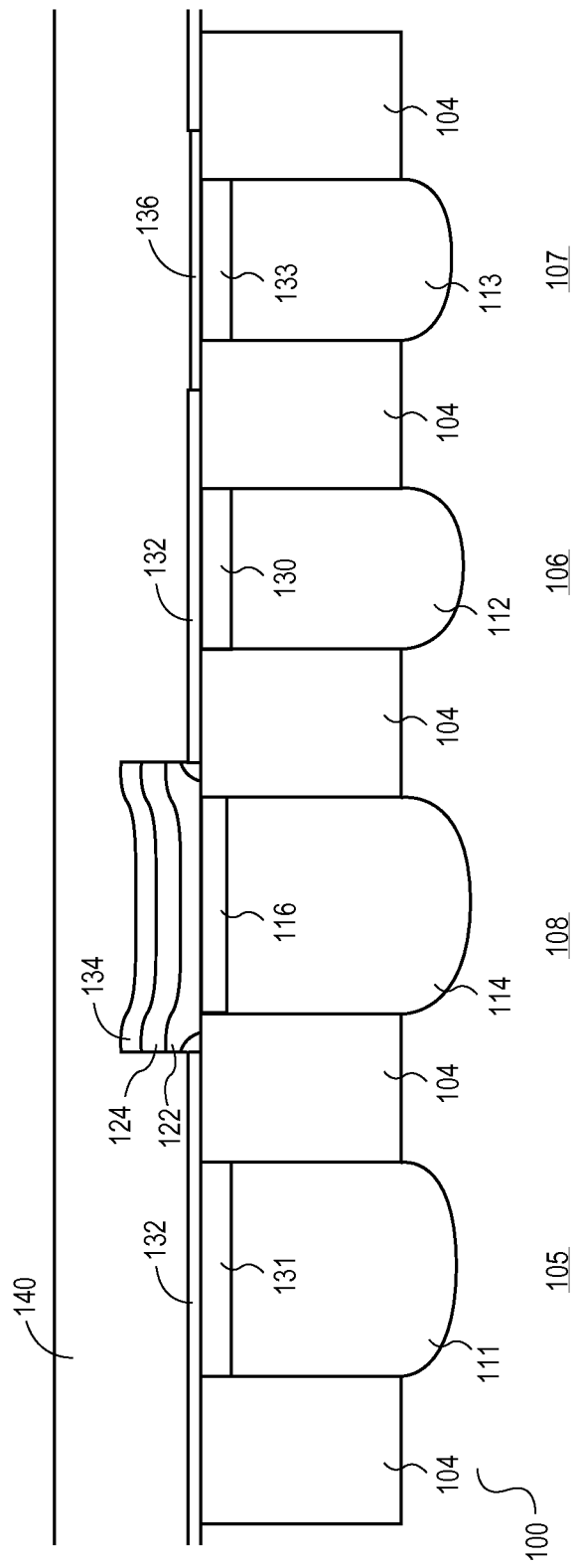
FIG. 9 illustrates the formation of a gate layer above a substrate, in accordance with an embodiment of the present invention.

Referring to the embodiment of FIG. 9, a gate layer 140 is then deposited above the substrate. Gate layer 140 may be composed of any conductor or semiconductor material suitable for accommodating a bias during operation of the non-volatile and MOS memory devices. In accordance with an embodiment, gate layer 140 is formed by a chemical vapor deposition process and is composed of doped poly-crystalline silicon. In another embodiment, gate layer 140 is formed by physical vapor deposition and is composed of a metal-containing material which may include but is not limited to, metal nitrides, metal carbides, metal silicides, hafnium, zirconium, titanium, tantalum, aluminum, ruthenium, palladium, platinum, cobalt and nickel. In one embodiment, gate layer 140 is a high work-function gate layer.

Figure 10:
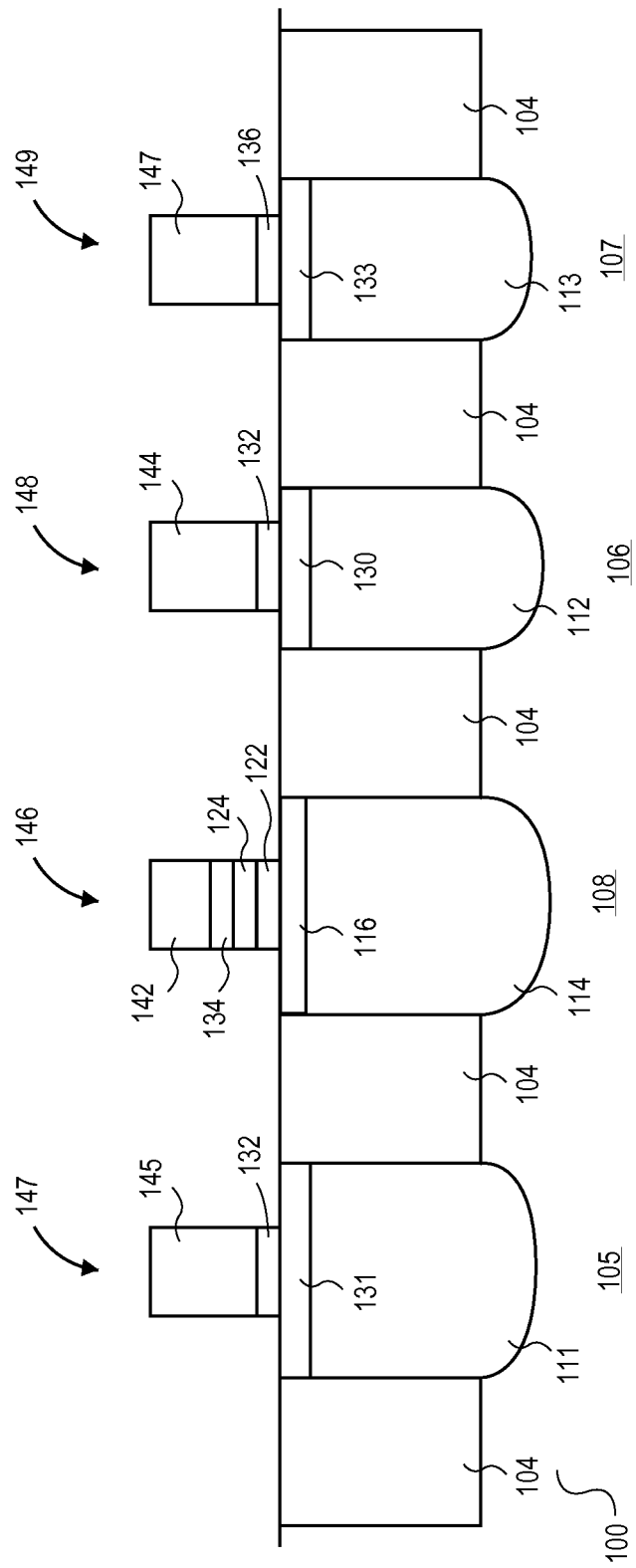
FIG. 10 illustrates the patterning of MOS device and non-volatile device gate stacks, in accordance with an embodiment of the present invention.

Referring to the embodiment of FIG. 10, non-volatile and MOS device gate stacks 146-149 may be formed through any process suitable to provide substantially straight sidewalls and with high selectivity to the substrate 100. In accordance with an embodiment, gate stacks 146-149 are patterned by lithography and etching. In an embodiment, etching is anisotropic and utilizes gases such as, but not limited to, carbon tetrafluoride ($CF_4$), $O_2$, hydrogen bromide (HBr) and chlorine ($Cl_2$). In a particular embodiment, HVFET gate stack 147 comprises gate layer 145 and gate dielectric layer 132. SONOS FET gate stack 146 comprises gate layer 142, blocking dielectric layer 134, charge-trapping layer 124, and tunnel layer 122. IO FET gate stack 148 comprises gate layer 144 and gate dielectric layer 132. LVFET gate stack 149 comprises gate layer 147 and gate dielectric layer 136.

Fabrication of MOS (e.g. MOSFET) and non-volatile (e.g. SONOS FET) memory devices may be completed utilizing conventional semiconductor processing techniques to form source and drain regions, spacers, and contact regions.

In the foregoing specification, various embodiments of the invention have been described for integrating non-volatile and MOS memory devices. In an embodiment, the dielectric gate stack of the non-volatile device can be integrated into the MOS memory process flow without affecting the baseline process for forming the MOS device channel dopants and gate dielectric layer. It is appreciated that embodiments are not so limited. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
    forming a pad dielectric layer above a MOS device region of a substrate;
    forming a patterned dielectric stack above a non-volatile device region of the substrate, the patterned dielectric stack comprising a tunnel layer, a charge-trapping layer formed on the tunnel layer, and a sacrificial top layer, the charge-trapping layer comprising a nitride layer;

simultaneously removing the sacrificial top layer from the non-volatile device region and the pad dielectric layer from the MOS device region; and simultaneously forming a gate dielectric layer above the MOS device region and forming a blocking dielectric layer above the charge-trapping layer, by oxidizing a top portion of the nitride layer and a top portion of the substrate, and depositing a material on the oxidized top portion of the nitride layer and the oxidized top portion of the substrate having a larger dielectric constant than the oxidized top portion of the nitride layer.

2. The method of claim 1, wherein the material comprises aluminum oxide, hafnium oxide, zirconium oxide, hafnium oxy-nitride, hafnium zirconium oxide or lanthanum oxide.

3. The method of claim 1, wherein oxidizing a top portion of the nitride layer and a top portion of the substrate comprises a radical oxidation technique.

4. A method comprising:
    forming a pad dielectric layer above a MOS device region of a substrate;
    forming a patterned dielectric stack above a non-volatile device region of the substrate, the patterned dielectric stack comprising a tunnel layer, a charge-trapping layer formed on the tunnel layer, and a sacrificial top layer, the charge-trapping layer comprising a nitride layer comprising at least 30% nitrogen, at least 45% silicon and less than 7% oxygen, by atomic percent;
    removing the sacrificial top layer from the non-volatile device region;
    removing the pad dielectric layer from the MOS device region; and
    simultaneously forming a gate dielectric layer above the MOS device region and forming a blocking dielectric layer above the charge-trapping layer.

5. The method of claim 4, wherein removing the sacrificial top layer and removing the pad dielectric layer comprises simultaneously removing the sacrificial top layer from the non-volatile device region and the pad dielectric layer from the MOS device region.

6. The method of claim 4, wherein forming the blocking dielectric layer above the charge-trapping layer comprises oxidizing a top portion of the nitride layer.

7. The method of claim 6, wherein forming the gate dielectric layer above the MOS device region comprises oxidizing a top portion of the substrate.

8. The method of claim 6, wherein forming the blocking dielectric layer further comprises forming a material on the oxidized top portion of the nitride layer having a larger dielectric constant than the oxidized top portion of the nitride layer.

9. The method of claim 8, wherein the material comprises aluminum oxide, hafnium oxide, zirconium oxide, hafnium oxy-nitride, hafnium zirconium oxide or lanthanum oxide.

10. The method of claim 6, wherein oxidizing the top portion of the nitride layer comprises a radical oxidation technique.

* * * * *